United States Patent [19]
Wood et al.

[11] Patent Number: 6,020,624
[45] Date of Patent: Feb. 1, 2000

[54] SEMICONDUCTOR PACKAGE WITH BI-SUBSTRATE DIE

[75] Inventors: Alan G. Wood; Salman Akram, both of Boise; Warren M. Farnworth, Nampa, all of Id.

[73] Assignee: Micron Technology, Inc., Boise, Id.

[21] Appl. No.: 09/053,273

[22] Filed: Apr. 1, 1998

Related U.S. Application Data

[60] Division of application No. 08/533,373, Sep. 25, 1995, Pat. No. 5,946,553, which is a continuation-in-part of application No. 08/387,687, Feb. 13, 1995, Pat. No. 5,686,317, which is a continuation of application No. 08/137,675, Oct. 14, 1993, abandoned, which is a continuation-in-part of application No. 07/709,858, Jun. 4, 1991, abandoned, application No. 07/788,065, Nov. 5, 1991, Pat. No. 5,440,240, and application No. 07/981,956, Nov. 24, 1992.

[51] Int. Cl.⁷ .......................... H01L 29/06; H01L 23/02; H01L 23/28
[52] U.S. Cl. .................. 257/618; 257/685; 257/78.7; 257/686; 257/777
[58] Field of Search ................. 257/618, 777, 257/737, 738, 778, 685, 686, 787; 438/613; 228/180.22

[56] References Cited

U.S. PATENT DOCUMENTS

| 5,302,891 | 4/1994 | Wood et al. ............................. 324/158 |
| 5,332,922 | 7/1994 | Oguchi et al. .......................... 257/723 |
| 5,408,190 | 4/1995 | Wood et al. ............................. 324/765 |
| 5,440,241 | 8/1995 | King et al. .............................. 324/765 |
| 5,483,174 | 1/1996 | Hembree et al. ....................... 324/765 |
| 5,483,741 | 1/1996 | Akram et al. ............................. 29/846 |
| 5,523,697 | 6/1996 | Farnworth et al. ..................... 324/758 |
| 5,541,525 | 7/1996 | Wood et al. ............................. 324/755 |
| 5,578,526 | 11/1996 | Akram et al. ......................... 437/209 |
| 5,585,282 | 12/1996 | Wood et al. ............................. 437/8 |
| 5,607,818 | 3/1997 | Akram et al. .......................... 430/311 |
| 5,637,907 | 6/1997 | Leedy ..................................... 257/780 |
| 5,686,317 | 11/1997 | Akram et al. ............................ 437/8 |
| 5,702,984 | 12/1997 | Bertin et al. ............................ 257/777 |
| 5,716,218 | 2/1998 | Farnworth et al. ...................... 438/15 |
| 5,719,438 | 2/1998 | Beilstein, Jr. et al. ................. 257/686 |

FOREIGN PATENT DOCUMENTS 3-69131  8/1989  Japan .

Primary Examiner—Mahshid Saadat
Assistant Examiner—Jhihan B. Clark
Attorney, Agent, or Firm—Stephen A. Gratton

[57] ABSTRACT

A method for forming an interconnect for semiconductor devices is provided. The interconnect includes raised contact structures covered with a conductive layer and having penetrating projections for penetrating contacts for the semiconductor devices. In an illustrative embodiment, the interconnect can be used to form a bi-substrate die. An interconnect substrate for the bi-substrate die includes control and logic circuitry and a memory substrate for the bi-substrate die includes a memory array. The interconnect can also be used to establish an electrical connection to microscopic contacts formed on a conventional die. In addition, the interconnect can be formed with three dimensional micro structures for contacting the microscopic contacts. Still further, the interconnect can be formed as wafer interconnect for electrically contacting dice contained on a wafer or for stacking multiple wafers.

25 Claims, 3 Drawing Sheets

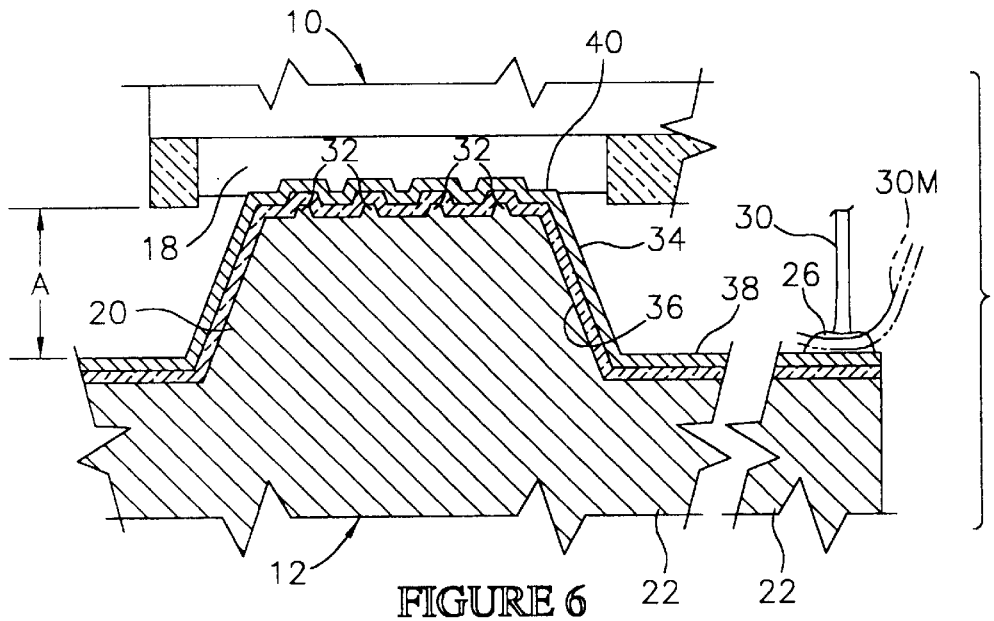
FIGURE 6
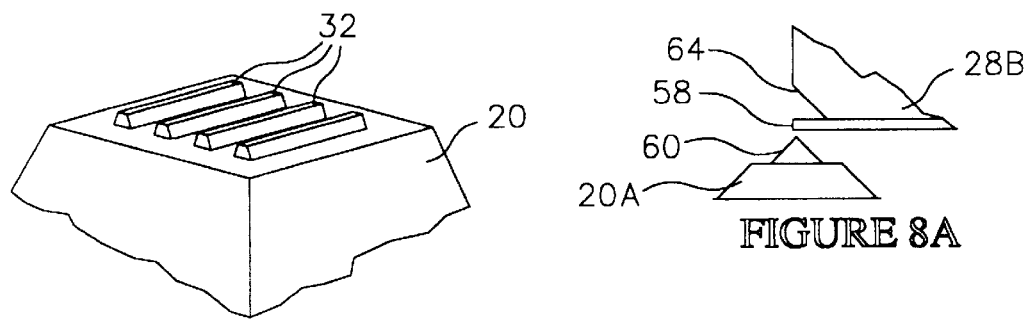
FIGURE 6A
FIGURE 8A
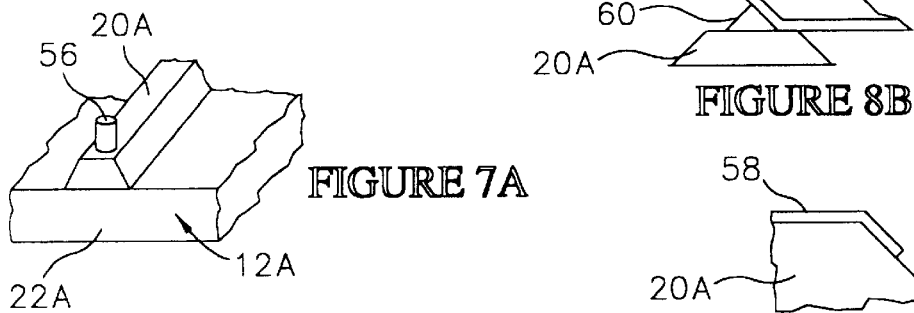
FIGURE 7A
FIGURE 8B
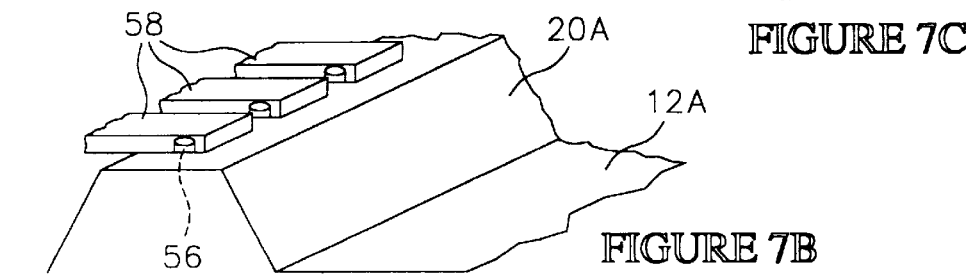
FIGURE 7C
FIGURE 7B

SEMICONDUCTOR PACKAGE WITH BI-SUBSTRATE DIE

CROSS REFERENCE TO RELATED APPLICATIONS

This application is a division of U.S. patent application Ser. No. 08/533,373 filed on Sep. 25, 1995, now U.S. Pat. No. 5,946,553, which is a continuation-in-part of application Ser. No. 08/387,687 filed on Feb. 13, 1995, U.S. Pat. No. 5,686,317; which is a continuation of application Ser. No. 08/137,675 filed on Oct. 14, 1993, abandoned; which is a continuation-in-part of application Ser. No. 07/709,858 filed on Jun. 4, 1991, abandoned; application Ser. No. 07/788,065 filed on Nov. 5, 1991; U.S. Pat. No. 5,440,240; and application Ser. No. 07/981,956, filed Nov. 24, 1992.

FIELD OF THE INVENTION

This invention relates generally to semiconductor manufacture and particularly to an improved method for forming an interconnect for electrically interconnecting semiconductor devices. The interconnect can be used to form an electrical connection to a memory cell array on a die, to form an electrical connection to a die having microscopic bond pads or to interconnect multiple dice contained on one or more wafers.

BACKGROUND OF THE INVENTION

As semiconductor manufacture advances to ultra large scale integration (ULSI), semiconductor devices continue to shrink in size. Circuit densities of several million transistors per die are now possible. As semiconductor devices shrink so does the die size. This has necessitated a reduction in bond pad sizes as well. It is anticipated that bond pads will soon be as small as 25 $\mu$m×25 $\mu$m on a side and spaced apart by only about 25 $\mu$m. A thickness of the bond pad stack also continues to shrink so that bond pads as thin as 5000 Å to 1 $\mu$m are anticipated.

One problem with the shrinking dice and bond pads is that establishing an electrical connection to the bond pads is becoming more difficult. A preferred method of forming this electrical connection is by wire bonding. During a typical die packaging process, the bond pads formed on the face of the die are connected to a lead frame using fine bond wires. Typically, several dice are wire bonded to a single lead frame. The semiconductor dice are then encapsulated and a trim and form operation is used to separate the packaged dice and to bend the lead frame to form external leads in a desired configuration (e.g., J-bend, gull wing).

Apparatus for wire bonding semiconductor dice are well known in the art. Earlier versions of wire bonding apparatus were manually operated by an operator viewing the dice and bond pads through a microscope. More recently, automated wire bonding apparatus include vision systems for automatically sensing the locations of the bond pads on the dice and lead fingers of the leadframe to perform the wire bonding process. However, this technology is limited by the size and spacing of the bond pads which must be individually aligned and contacted by a wire bonding tool.

Another problem with current packaging technology is in the fixed relationship of the bond pads and interconnect circuitry on the die. For example, a conventional semiconductor DRAM die includes a memory cell array containing rows and columns of FETs associated with capacitors which store an electrical charge. The DRAM die also contains control and logic circuitry that interconnect to the memory cell array and terminate in the bond pads on the face of the die. The control and logic circuitry, which is typically on the periphery of the memory cell arrays, includes devices for addressing the array and for inputting and outputting data from the array. Typically the die is designed and constructed as a unitary structure containing both the memory cell array and the interconnect circuitry. The location of these components is fixed by the design and construction of the die.

In some applications it would be advantageous to be able to construct a die or a package in separate modules. For example, a memory cell array could be constructed as a component that is separate from the interconnect circuitry. This would allow a standard memory array to be provided but customized with different interconnect circuitry and bond pad arrangements for a particular application. Manufacturing costs could be reduced by the standardization and interchangeability of the different components. In addition, although contacts to the memory cells could remain small, the location and size of bond pads for connection to the outside could be made larger. This same scheme could be used to form a packaged die, to form an electrical connection to a die having microscopic bond pads, and to stack and interconnect dice contained on the wafers.

The present invention is directed to a method for forming an interconnect for semiconductor devices. The method can be used to form an electrical connection to microscopic contacts to semiconductor devices. In addition, the method can be used to form an electrical connection to microscopic bond pads for packaging a single die or multiple dice contained on a wafer.

Accordingly, it is an object of the present invention to provide an improved method for forming an interconnect for semiconductor devices.

It is a further object of the present invention to provide an improved semiconductor die having a separate interconnect substrate for making an electrical connection to memory devices contained in the die and for providing convenient sized and located bonds pads for connection to the outside.

It is a still further object of the present invention to provide an improved interconnect for making an electrical connection to microscopic bond pads on a semiconductor die.

It is yet another object of the present invention to provide an improved method for interconnecting multiple dice contained on a wafer and for interconnecting multiple wafers to one another.

Other objects, advantages and capabilities of the present invention will become more apparent as the description proceeds.

SUMMARY OF THE INVENTION

In accordance with the present invention, a method for forming an interconnect for making an electrical connection to semiconductor devices is provided. The interconnect includes raised contact structures for physically contacting and establishing an electrical connection to contacts in electrical communication with the semiconductor devices. These contacts on the die can include flat metallic bond pads, bond pads that are bumped with solder balls, and metal runners. The raised contact structures include one or more penetrating projections for piercing the contacts to the semiconductor devices to a limited penetration depth. In addition, each raised contact structure can be covered with a conductive layer that is bonded to a corresponding contact to the semiconductor devices.

The interconnect can be used to form a memory device such as a DRAM die out of two separate substrates rather than as a conventional monolithic structure. A first substrate, termed herein as a "memory substrate", contains the memory cell array for the DRAM. A second substrate, termed herein as an "interconnect substrate", contains control and logic circuitry, and bonding pads for connection to the outside world. The memory substrate and interconnect substrate are aligned and then placed into physical contact so that the penetrating projections on the raised contact structures penetrate the contacts on the memory substrate and establish a permanent electrical connection therebetween. The contact structures on the interconnect substrate and the contacts on the memory substrate are then bonded together.

The assembled memory substrate and interconnect substrate can be mechanically bonded together to make a permanent contact using a low temperature thermal process. This forms a bi-substrate die that can then be packaged in an encapsulating material. Advantageously, the contacts on the memory substrate can be small and dense thereby accommodating the size reductions in dense memory arrays. On the other hand, the bonding pads on the interconnect substrate can be relatively large to accommodate a subsequent wire bonding process and connection to the outside world. Another advantage is that manufacture of the bi-substrate die is simplified because a standardized memory substrate can be volume manufactured and combined with a customized interconnect substrate having a desired control and logic circuitry and a desired bonding pad configuration. Conversely the interconnect substrate can be standardized and the memory substrate customized.

Alternately the interconnect substrate does not need to include control and logic circuitry. In this case, the die could be a conventional monolithic structure having microscopic bond pads in electrical communication with the semiconductor devices and integrated circuits formed on the die. The interconnect substrate allows an electrical connection to be made to the microscopic bond pads on the die. This connection can be used for testing the die and for establishing a permanent electrical connection to the die.

An interconnect constructed in accordance with the invention can also be used to electrically connect extremely small and thin contact locations (e.g., metallic bond pads, metal runners, solder bumps) on a semiconductor die for testing or permanent use. In this case, the penetrating projections for the interconnect can be formed as three dimensional micro structures such as cylindrical tips adapted to penetrate into the contact locations on the die to a limited penetration depth. The micro structures can also be formed to engage a contact location on the die, such as a metal runner, that can bend or deform to a shape of the micro structure.

An interconnect constructed in accordance with the invention can also be used to electrically connect multiple semiconductor dice contained on a semiconductor wafer. This embodiment can be constructed to accommodate both regular sized bond pads and thin microscopic bond pads. In this embodiment the interconnect is wafer sized and includes raised contact structures having penetrating projections covered with a conductive layer. Two or more wafers can be stacked together and electrically connected using this type of wafer interconnect. Alternately, a wafer can be formed with the dice on a face of the wafer and raised contact structures on a backside of the wafer. Using this arrangement multiple wafers can be stacked together in electrical communication.

BRIEF DESCRIPTION OF THE DRAWINGS

FIG. 6 is a cross sectional view taken along section line 6—6 of FIG. 4 showing a contact structure on an interconnect engaging a contact on a memory substrate or die;

FIG. 6A is a perspective view of a contact structure for an interconnect constructed in accordance with the invention;

FIG. 7A is a schematic perspective view of a contact structure constructed in accordance with the invention with a three dimensional penetrating projection;

FIG. 7B is schematic perspective view of the contact structure shown in FIG. 7A engaging contacts on a semiconductor die;

FIG. 7C is a schematic side elevation view of another contact on a die formed as a metal runner and engaging a contact structure on an interconnect constructed in accordance with the invention;

FIGS. 8A and 8B are schematic side elevation views illustrating a contact structure constructed in accordance with the invention engaging a deformable contact formed on a die;

DETAILED DESCRIPTION OF THE PREFERRED EMBODIMENT

Figure 1:
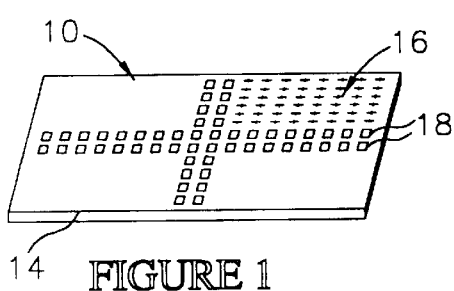
FIG. 1 is a schematic perspective view of a memory substrate for a bi-substrate die constructed in accordance with the invention.
Figure 2:
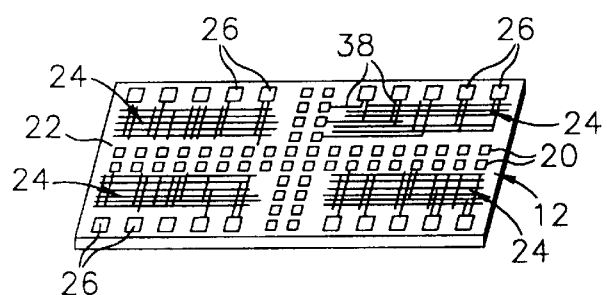
FIG. 2 is a schematic perspective view of an interconnect substrate for constructing a bi-substrate die in accordance with the invention.
Figure 3:
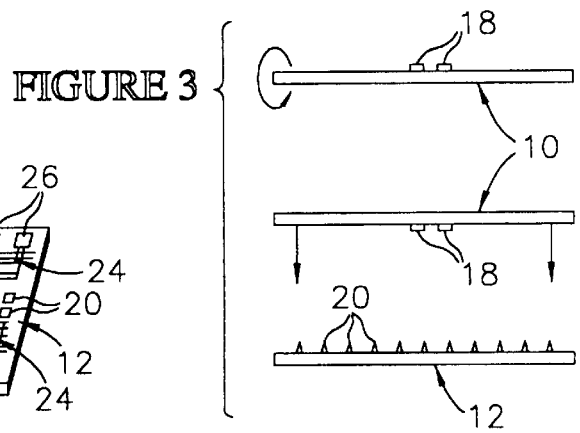
FIG. 3 is a schematic drawing showing an assembly sequence for constructing a bi-substrate die in accordance with the invention.
Figure 4:
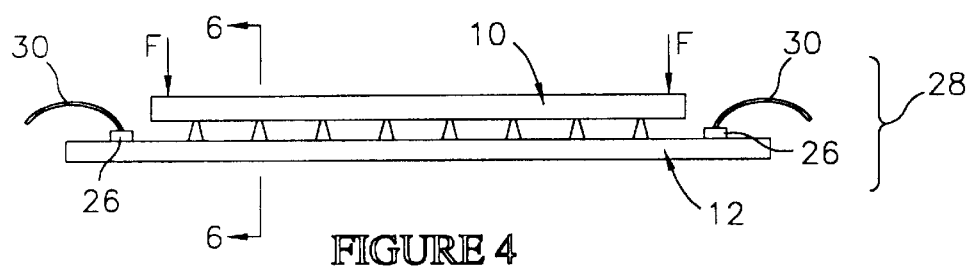
FIG. 4 is a schematic drawing of a bi-substrate die constructed in accordance with the invention.

Referring now to FIGS. 1–3, the construction of a bi-substrate die in accordance with the invention is shown. A memory substrate 10 (FIG. 1) and an interconnect 12 substrate (FIG. 2) are used to construct the bi-substrate die 28 (FIG. 4). The memory substrate 10 includes a silicon substrate 14 wherein a memory cell array 16, represented by the cross hatched area, is constructed. The memory cell array 16 includes rows and columns of semiconductor devices such as FETs and capacitors constructed using techniques that are well known in the art. As an example, the semiconductor devices can be constructed as integrated circuits for a dynamic random access memory (DRAM)

The memory substrate 10 also includes a plurality of contacts 18 in electrical communication with the semiconductor devices formed in the memory cell array 16. The contacts 18 are preferably metallic pads formed of a material such as aluminum or another highly conductive metal. The contacts 18 are equivalent to bond pads on a conventional die but can be made much smaller and thinner than conventional bond pads. By way of example, the contacts 18 can be polygonal in shape, about 10–25 µm on a side, and with a thickness of from about 1000 Å to 1.0 µm. In the embodiment shown in FIG. 1, the contacts 18 are arranged in pairs in a cross shaped pattern. This pattern, however, as well as the cited size range, are merely exemplary.

The memory substrate 10 is adapted for mating engagement with the interconnect substrate 12 shown in FIG. 2. As shown in FIG. 3, during an assembly process the memory substrate 10 is flipped face down, aligned with the interconnect substrate 12 and then brought into physical contact with the interconnect substrate 12.

The interconnect substrate 12 includes a silicon substrate 22 and a plurality of raised contact structures 20 which correspond to the location of the contacts 18 on the memory substrate 10. The construction of the raised contact structures 20 will become more apparent as the description proceeds. The interconnect substrate 12 also includes control and logic circuitry 24 formed in the silicon substrate 22. The control and logic circuitry 24 includes various semiconductor devices formed or mounted on the silicon substrate 22 using techniques that are known in the art. The control and logic circuitry 24 is adapted to access and control the semiconductor devices formed in the memory cell array 16 of the memory substrate 10.

The raised contact structures 20 on the interconnect substrate 12 are in electrical communication with the control and logic circuitry 24. The raised contact structures 20 are also in electrical communication with bonding pads 26. The bonding pads 26 can be formed with a relatively large size (e.g., 100 µm×100 µm) to facilitate a subsequent wire bonding process. In addition, the bonding pads 26 are spaced in a desired pattern along the sides of the interconnect substrate 12. The bonding pads 26 can be formed of a material such as aluminum alloyed with other metals useful in pad metallurgy. As shown in FIG. 4, following assembly of the die 28 thin bond wires 30 are wire bonded to the bonding pads 26 on the interconnect substrate 12. The peripheral shape of the interconnect substrate 12 can be larger than that of the memory substrate 10 so that in the assembled die 28 the bonding pads 30 are exposed for wire bonding.

Wire bonding can be effected using a wire bonder apparatus and conventional semiconductor wire bonding techniques (e.g., gold ball thermosonic, aluminum wedge). One suitable wire bonding apparatus for performing the wire bonding step is manufactured by Kulicke and Soffa, Horsham, Pa. and is designated as a K&S Model 1484. Although wire bonding is the preferred method of forming an electrical connection to the bonding pads 26, a soldered connection can also be employed. In addition, a mechanical electrical connection 30M (FIG. 6) such as a sliding or piercing structure could also be employed.

Referring now to FIG. 6, the construction of the contact structure 20 and its function in establishing an electrical connection with a contact 18 on the memory substrate 10 are shown. The contact structure 20 is a raised member formed integrally with the silicon substrate 22 for the interconnect 12 preferably by etching the silicon substrate 22. The contact structure 20 includes penetrating projections 32 that are designed to penetrate into the contacts 18 on the memory substrate 10 to a limited penetration depth. The designed penetration depth can also be a function of the thickness of the contact 18. The contact structure 20 also includes a conductive layer 34 formed atop the penetrating projections 32. The conductive layer 34 is insulated from the silicon substrate 22 by an insulating layer 36. In addition, the conductive layer 34 is in electrical communication with conductive traces 38 formed on the silicon substrate 22 in electrical communication with the bonding pads 26. The conductive layer 34 is also in electrical communication with the control and logic circuitry 24 (FIG. 2). As shown in FIG. 2, the conductive traces 38 establish an electrical connection between the contact structures 20 and the bonding pads 26 and an electrical connection between the contact structures 20, the contacts 18 and the control and logic circuitry 24.

The contact structure 20 can be formed using an etch process. Such an etch process is described in copending, commonly assigned U.S. Pat. No. 5,686,317 and in U.S. Pat. No. 5,326,428 and U.S. Pat. No. 5,419,807 which are incorporated herein by reference.

Still referring to FIG. 6, for fabricating the contact structures 20, initially the penetrating projections 32 are formed using an etch mask (not shown). The etch mask can be formed out of a material such as silicon nitride ($Si_3N_4$) by blanket depositing the material (e.g., CVD) followed by photopatterning and then etching (e.g., wet or dry etch). Using the etch mask the exposed silicon substrate 22 is etched to form the penetrating projections 32. In this step a wet or dry isotropic, or anisotropic, etch process is used to form the projections 32. For an anisotropic etch, in which the etch rate is different in different single crystal directions, an etchant solution containing a mixture of KOH and $H_2O$ can be utilized. This results in the penetrating projections 32 being formed with sidewalls that are sloped at an angle of approximately 54° with the horizontal. In addition, depending on the size of the etch mask, the penetrating projections can be formed as elongated blades as shown in FIG. 6A or miniature pyramids.

In place of an anisotropic etch, an isotropic etch can be used to form the penetrating projections 32 with radiused sidewalls or a rounded profile (not shown). For an isotropic etch in which the etch rate is the same in all directions, an etchant solution containing a mixture of HF, $HNO_3$ and $H_2O$ can be utilized. This will result in the projections 32 having a pointed tip and a radiused sidewall contour (not shown).

The placement and peripheral dimensions of the penetrating projections 32 corresponds to the placement and peripheral dimensions of the contacts 18 formed on the memory substrate 10. The height of each projection 32 is preferably about ⅒ to ¾ the thickness of the metal layer that forms the contacts 18. The projections 32 will therefore not completely penetrate the full thickness of the contacts 18 and an upper surface 40 of the contact structure 20 provides a stop plane for limiting further penetration of the projections 32 into the contact 18. In addition, the height of the projections 32 is selected to allow good electrical contact. As an example, the height of each penetrating projection 32 measured from the upper surface 40 of the silicon substrate 22 to the tip of the projection 32 will be on the order of 500 Å–1 µm. Example spacing between the projections 32 would be about 5 µm, while a length of the projections 30 (i.e., dimension perpendicular to the cross section shown) would be dependent on the size of the bond pad. This length would be smaller than the bond pad size (e.g., 10 µm for a 25 µm bond pad).

Still referring to FIG. 6, following the formation of the penetrating projections 32, the silicon substrate 22 is etched again using another etch mask (not shown) to form the raised contact structures 20. As before, either a wet or dry isotropic or anisotropic etch process can be used to etch the silicon substrate 22. Typical etching techniques comprise wet anisotropic etching with a mixture of KOH:H$_2$O. With an anisotropic etch, the sidewalls of the contact structures 20 will be sloped at an angle of about 54° with the horizontal and the contact structures 20 will exhibit a generally pyramidally shaped cross section. FIG. 6A clearly shows the shape of the etched contact structures 20 and the etched penetrating projections 32. Again, depending on the size of the etch mask, the contact structures 20 can also be formed as pyramids or as elongated blades (e.g., 20A—FIG. 7B).

The height of the contact structures 20 is selected to provide a separation distance of "A" (FIG. 6) between the memory substrate 10 and the interconnect substrate 12. This helps to prevent particulate contamination from penetrating and damaging the memory substrate and/or interconnect substrate 12. The height of each contact structure 20 measured from a surface of the silicon substrate 22 can be on the order of 1–100 μm and the width about 4–80 μm, but dependent on the size and pitch of the contacts 18.

Still referring to FIG. 6, following the formation of the contact structures 20, the insulating layer 36 is formed over the contact structures 20 and over silicon substrate 22. The insulating layer 36 can be formed by oxidation of the silicon substrate 22 such as by exposing the silicon substrate 22 to an oxidizing atmosphere in a reaction chamber. Silicon dioxide can be deposited using plasma CVD techniques. Here TEOS (tetraethylorthosilane) can be injected into the reaction chamber to grow silicon dioxide (SiO$_2$) at a temperature of about 400° C. Another commonly used insulator suitable for this purpose is Si$_3$N$_4$. A representative thickness for the insulating layer 36 is from about 500 Å to 10,000 Å.

The conductive layer 34 is formed on top of the insulating layer 36 and over the contact structures 20. The conductive layer 34 is preferably a highly conductive metal such as aluminum that can be deposited and patterned as required. By way of example, the conductive layer 34 can deposited using a process such as CVD, to a thickness of about 600 Å–1200 Å and then photopatterned and etched to cover just the contact structures 20 and penetrating projections 32. One method for forming the conductive layer 34 is by electrophoretic deposition of a layer of photoresist followed by etching as disclosed in U.S. Pat. No. 5,607,818, incorporated herein by reference.

The conductive traces 38 are formed on the silicon substrate 22 in electrical communication with the conductive layer 34 for each contact structure 20. The conductive traces 38 can be formed of a same material as the conductive layer 34 using the same deposition and patterning process or alternately out of a same or different material and a subsequent deposition and patterning process. Here different layers of material have the advantage of optimizing the electrical/mechanical properties of the contact structure 20 with the contact 18. The patterning process routes the conductive traces 38 to the bonding pads 26 and to contact vias (not shown) in electrical communication with the control and logic circuitry 24 formed on the substrate 22. The logic/control circuitry 24 can typically be formed after the formation of the structure 20.

Referring back again to FIG. 3, during assembly the memory substrate 10 is flipped face side down and aligned with the interconnect substrate 12. In particular, the contacts 18 on the memory substrate 10 are aligned with the contact structures 20 on the interconnect substrate 12. Optical alignment techniques such as flip chip optical alignment can be used to align the contacts on the memory substrate 10 with the raised contact structures 20 on the interconnect substrate 12. By way of example, an aligner bonder tool as described in U.S. Pat. No. 4,899,921 to Bendat et al. can be used to optically align the memory substrate 10 with the interconnect substrate 12.

With reference to FIG. 4, following the alignment procedure the memory substrate 10 and interconnect substrate 12 are placed in physical contact with a predetermined force F. This allows the penetrating projections 32 (FIG. 6) to penetrate the contacts 18 (FIG. 6) and establish an electrical connection between the conductive layer 34 on the contact structures 20 of the interconnect 12 and contacts 20 on the memory 10.

Following alignment and physical contact, the memory substrate 10 and interconnect substrate 12 can be bonded together. Specifically, the conductive layer 34 formed on the contact structures 20 can be bonded to the contacts 18 on the memory 10 by heating these metal layers to a relatively low temperature thereby forming a good physical/mechanical bond between the metals. For example with the conductive layer 34 and contacts 18 formed of aluminum, or an aluminum alloy, heating the memory substrate 10 and interconnect substrate 12 to a temperature of 150–400° C. will bond the metallic surfaces together. This temperature range is low enough to not have a detrimental effect on the active semiconductor devices formed on the memory substrate 10 and interconnect substrate 12. Furthermore, ultra sonic energy, or localized heating such as with a focused laser beam, can be utilized to form a bond between the conductive layer 34 and the contacts 18.

In addition to bonding the conductive layer 34 and contacts 18, prior to the packaging process an insulating layer (not shown) such as an oxide, nitride or a polyimide layer (or combinations of these materials) can be formed on the exposed portions of the memory substrate 10 and interconnect substrate 12. Preferably such a process can be performed at a temperature of less than 300° C. As an example, with the substrates 14 and 22 for the memory 10 and interconnect 12 formed of silicon, an oxide layer can be grown using a low temperature plasma enhanced chemical vapor deposition process (PECVD). The PECVD process can include O$_2$ and a silicon containing species such as silane (silicon tetrahydride-SiH$_4$) or TEOS (tetraethylorthosilicate). The deposited oxide can be about 5 μm to 10 μm in thickness. This deposition process further helps to bond the memory substrate 10 and interconnect substrate 12 together and to maintain the mechanical bond therebetween. In addition, the oxide helps to insulate exposed surfaces in the packaged assembly.

Figure 5:
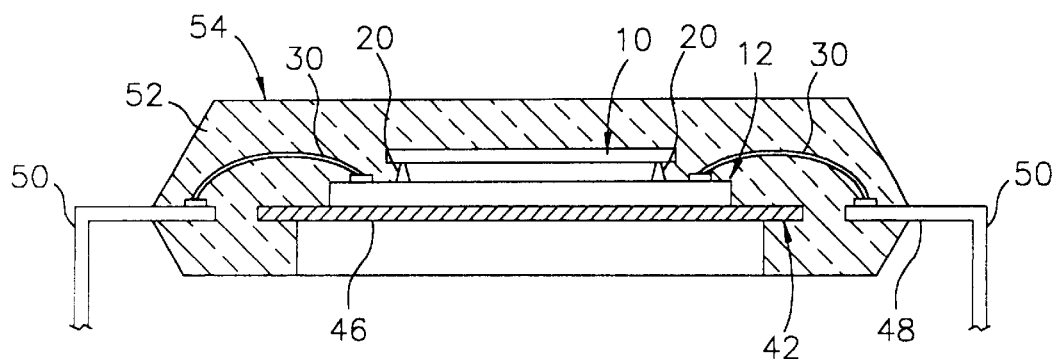
FIG. 5 is a schematic drawing of a packaged bi-substrate die constructed in accordance with the invention.
Figure 9:
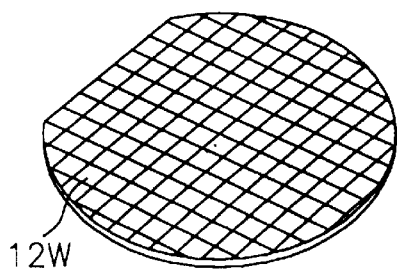
FIG. 9 is a perspective view of an alternate embodiment wafer interconnect constructed in accordance with the invention.

Referring now to FIG. 5, assembly of the die 28 can be followed by a packaging process. A leadframe 42 for packaging the die 28 includes a mounting paddle 46 and lead fingers 48. During the packaging process the interconnect substrate 12 is adhered to the mounting paddle 46 using a suitable adhesive (e.g., epoxy, silicone) or double sided adhesive tape. In addition, the bonding pads 26 on the interconnect substrate 12 are wire bonded to corresponding connection points on the lead fingers 48.

Additionally, during the packaging process the memory substrate 10, interconnect substrate 12 and most of the leadframe 42 are packaged in an encapsulating material 52. The encapsulating material 52 can be an epoxy, silicone, room temperature vulcanizing (RTV) or polyimide material. Suitable compounds are commercially available from Sumitomo, Bakelite and Dexter/Hysol. Following the encapsulation process the leadframe 42 is trimmed and the lead fingers 48 are bent to form the external leads 50 for the completed package 54.

It is to be understood however, that the die 28 does not need to be packaged but can be used as an unpackaged die. In this case the interconnect substrate 12 can be used for testing and burning-in the die 28 to certify its performance as a known good die (KGD). A test carrier as disclosed in U.S. Pat. No. 5,440,240, to Wood et al., incorporated herein by reference, can be used to test the die 28. The interconnect substrate 12 can also be utilized with such a carrier to test and burn-in the die 28 prior to packaging.

Figure 1A:
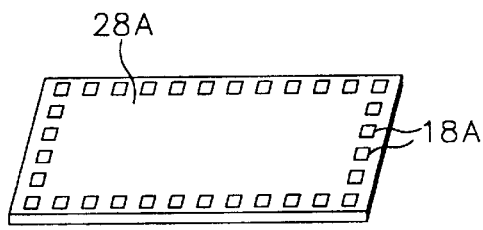
FIG. 1A is a schematic perspective view of a conventional monolithic die having microscopic bond pads.

FIG. 1A illustrates an alternate embodiment die 28A that can be formed and packaged in substantially the same manner as die 28. However, the alternate embodiment die 28A is a conventional die having both memory and control circuitry and microscopic bond pads 18A in electrical communication with this circuitry. In this case, the interconnect substrate 12 need not contain control and logic circuitry but would provide a permanent electrical connection to the microscopic bond pads 18A.

Referring now to FIGS. 7A and 7B, an interconnect substrate 12A constructed with a penetrating projection formed as a three dimensional micro structure 56 is shown. The interconnect substrate 12A is adapted to establish an electrical connection with a semiconductor die (such as die 28A—FIG. 1A) having very small and densely spaced contact locations such as microscopic bond pads or a pattern of metal runners.

As shown in FIG. 7A, the interconnect substrate 12A includes a silicon substrate 22A having a plurality of raised contact structures 20A formed thereon. The raised contact structures 20A are formed substantially as previously described as contact structures 20 (FIG. 6) but are elongated rather than pyramidal in shape. Each contact structure 20A includes one or more three dimensional micro structures 56 that are formed substantially as previously described as the penetrating projections 32 (FIG. 6).

As shown in FIG. 7B, the three dimensional micro structures 56 are adapted to penetrate metal runners 58 formed on a semiconductor die (e.g., die 28A—FIG. 1A). The micro structures 56 are spaced along the contact structures 20A with a spacing that matches the pitch of the metal runners 58. Each micro structure 56 is covered with a conductive layer in electrical communication with a pattern of conductive traces equivalent to the conductive layer 34 (FIG. 6) and conductive traces 38 (FIG. 6) previously described.

As shown in FIG. 7C, the die can also be configured such that the metal runners 58 conform to the shape of the contact structures 20A. Another embodiment of this concept is illustrated in FIGS. 8A and 8B. In this case the contact structure 20A includes an etched blade 60. The blade 60 rather than penetrating the runner 58 is adapted to deform the runner 58 so that electrical contact between the runner 58 and the conductive layer formed on the blade 60 is made. A die 28B is formed with a beveled edge 64 to facilitate deformation of the metal runner 58.

Figure 10:
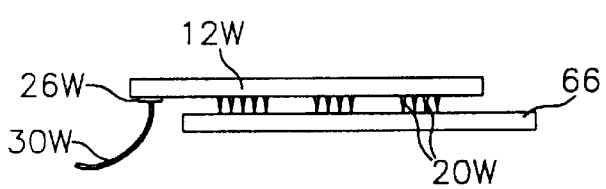
FIG. 10 is a schematic side elevation view of the wafer interconnect engaging a semiconductor wafer.

Referring now to FIGS. 9–13, a wafer interconnect 12W constructed in accordance with the invention is shown. The wafer interconnect 12W is adapted to establish an electrical connection with semiconductor dice contained on a wafer 66 (FIG. 10). The wafer interconnect 12W is fabricated substantially as previously described as interconnect substrate 12 but is wafer sized rather than die sized.

As shown in FIG. 10, the wafer interconnect 12W and wafer 66 are aligned and brought into physical contact such that raised contact structures 20W on the wafer interconnect 12W engage corresponding contact locations (e.g., bond pads) on the semiconductor dice formed on the wafer 66. With the interconnect 12W and wafer 66 assembled as shown in FIG. 10, a cross section through the contact structures 20W and contact locations on the wafer 66 would be substantially similar to FIG. 6. Additionally a conductive layer formed on the contact structures 20W equivalent to conductive layer 34 can be bonded to the contact locations on the wafer 66 using heat or ultrasonic energy.

Figure 11:
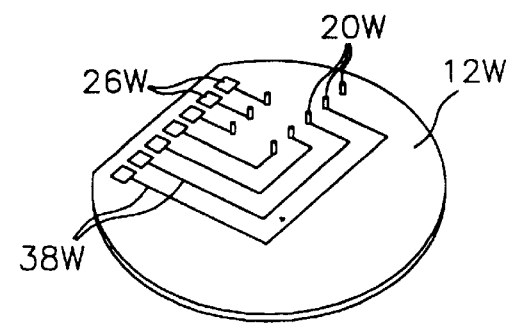
FIG. 11 is an enlarged schematic perspective view of the wafer interconnect showing contact structures formed thereon.

As shown in FIG. 11, the contact structures 20W are in electrical communication with conductive traces 38W formed on the wafer interconnect 12W. The conductive traces 38W terminate in bonding pads 26W. As shown in FIG. 10, bond wires 30W can be wire bonded to the bonding pads 26W to electrically connect to external circuitry as required.

Figure 12:
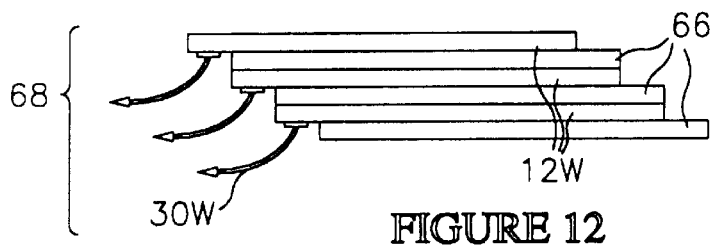
FIG. 12 is a schematic side elevation view showing multiple wafer interconnects and wafers stacked on one another to form a stacked array.
Figure 12A:
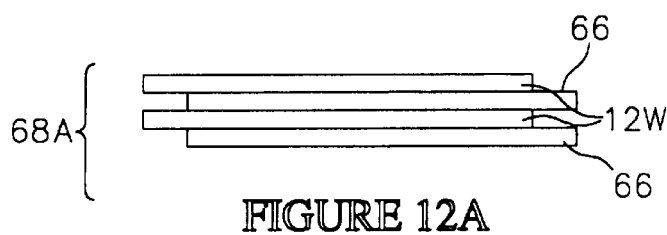
FIG. 12A is a schematic side elevation view of an alternate embodiment stacked array.

As shown in FIG. 12, a stacked array 68 comprising multiple wafer interconnects 12W and wafers 66 can be formed. In FIG. 12 the stacked array 68 is formed in a stair step pattern of wafer interconnects 12W and wafers 66. In FIG. 12A a stacked array 68A is formed with an alternating offset between the wafer interconnects 12W and wafers 66.

Figure 13:
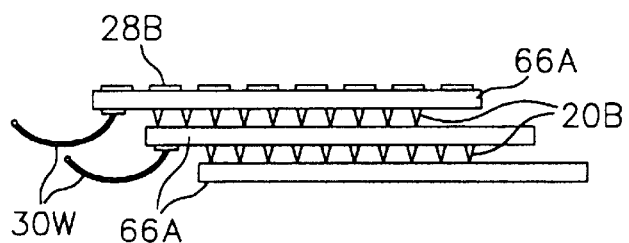
FIG. 13 is a schematic cross sectional view of wafers formed with interconnects constructed in accordance with the invention on a backside and assembled together in a stacked array.

In FIG. 13 a wafer 66A is formed with semiconductor dice 28B on a face side and contact structures 20B on a backside. The interconnect component is thus formed integrally with the wafer 66A. This permits multiple wafers 66A to be stacked face side to backside and electrically interconnected.

Although the method of the invention has been described with reference to certain preferred embodiments and preferred methods, as will be apparent to those skilled in the art, certain changes and modifications can be made without departing from the scope of the invention as defined by the following claims.

We claim:

1. A semiconductor package comprising:
   a first substrate comprising first circuitry and a plurality of raised contact structures in electrical communication with the first circuitry, the contact structures comprising planar surfaces, projections on the planar surfaces, and conductive layers at least partially covering the projections; and
   a second substrate comprising a plurality of semiconductor devices and a plurality of contacts in electrical communication with the devices;
   the first substrate bonded to the second substrate with the contact structures and the contacts in electrical contact, and with the projections penetrating the contacts to limited penetration depths while the planar surfaces limit further penetration and provide a separation between the first substrate and the second substrate.

2. The package of claim 1 wherein the conductive layers comprise metal layers bonded to the contacts on the second substrate.

3. The package of claim 1 wherein the first circuitry comprises a plurality of semiconductor devices configured as control and logic circuitry.

4. The package of claim 1 wherein the semiconductor devices on the second substrate comprise memory devices.

5. The package of claim 1 wherein the first substrate comprises a plurality of pads in electrical communication with the conductive layers and wire bonded to a portion of a leadframe attached to the first substrate.

6. The package of claim 1 further comprising a portion of a leadframe bonded to the first substrate and an encapsulant at least partially covering the portion, the first substrate and the second substrate.

7. The package of claim 1 further comprising a plurality of pads on the first substrate in electrical communication with the conductive layers and a plurality of leads in electrical communication with the pads.

8. A semiconductor package comprising:
an interconnect substrate comprising control circuitry, and a plurality of raised contact structures in electrical communication with the control circuitry, the contact structures comprising planar surfaces, projections on the surfaces, and conductive layers at least partially covering the projections; and
a memory substrate bonded to the interconnect substrate comprising a plurality of semiconductor devices and a plurality of contacts in electrical communication with the devices;
the conductive layers on the contact structures bonded to the contacts on the memory substrate in electrical communication therewith, with the projections penetrating the contacts while the planar surfaces limit further penetration and provide a separation between the interconnect substrate and the memory substrate.

9. The package of claim 8 further comprising an encapsulant covering the interconnect substrate and the memory substrate.

10. The package of claim 8 further comprising a plurality of external leads in electrical communication with the conductive layers.

11. The package of claim 8 wherein the interconnect substrate, the contact structures and the memory substrate comprise silicon.

12. The package of claim 8 wherein each contact structure comprises a plurality of projections.

13. The package of claim 8 wherein the memory substrate comprises a semiconductor wafer comprising a plurality of semiconductor dice.

14. A semiconductor package comprising:
a plurality of external leads;
an interconnect substrate comprising control circuitry, a plurality of contact structures in electrical communication with the control circuitry and the external leads, the contact structures comprising planar surfaces, projections on the planar surfaces, and conductive layers at least partially covering the projections;
a memory substrate comprising a plurality of contacts and a plurality of semiconductor memory devices in electrical communication with the contacts, the memory substrate bonded to the interconnect substrate with the projections penetrating the contacts while the planar surfaces limit further penetration and maintain a spacing between the memory substrate and the interconnect substrate; and
an encapsulant at least partially covering the interconnect substrate and the memory substrate.

15. The package of claim 14 wherein the external contacts comprise lead fingers of a lead frame.

16. The package of claim 14 wherein the control circuitry comprises a plurality of semiconductor devices.

17. The package of claim 14 wherein the interconnect substrate comprises silicon and the conductive layers comprise metal.

18. The package of claim 14 wherein the memory substrate comprises a semiconductor wafer comprising a plurality of semiconductor dice.

19. A semiconductor package comprising:
a portion of a lead frame comprising a plurality of external leads;
an interconnect substrate attached to the portion of the lead frame, the interconnect substrate comprising control circuitry, and a plurality of contact structures in electrical communication with the control circuitry and with the external leads, the contact structures comprising planar surfaces, projections on the planar surfaces, and conductive layers at least partially covering the planar surfaces;
a memory substrate comprising a plurality of semiconductor devices and a plurality of contacts in electrical communication with the devices, the contacts on the memory substrate bonded to the conductive layers on the contact structures with the projections penetrating the contacts and the surfaces limiting penetration; and
an encapsulant at least partially covering the interconnect substrate and the memory substrate.

20. The package of claim 19 wherein the interconnect substrate and the contact structures comprise silicon.

21. The package of claim 20 wherein the interconnect substrate comprises a plurality of pads in electrical communication with the contact structures and wire bonded to the portion of the lead frame.

22. The package of claim 20 wherein each contact structure comprises a plurality of penetrating projections.

23. The package of claim 20 wherein each contact structure comprises a plurality of penetrating projections comprising elongated blades.

24. A semiconductor package comprising:
an interconnect substrate comprising first circuitry, a plurality of contact structures in electrical communication with the first circuitry, and a plurality of pads in electrical communication with the contact structures configured for electrical communication with outside circuitry, the contact structures comprising planar surfaces, projections on the planar surfaces, and conductive layers at least partially covering the projections; and
a semiconductor wafer comprising a plurality of semiconductor dice, each die comprising a plurality of contacts and semiconductor devices in electrical communication with the contacts, the wafer bonded to the interconnect substrate with the projections on the contact structures penetrating the contacts while the planar surfaces limit further penetration and maintain a spacing between the wafer and the interconnect substrate.

25. The package of claim 24 further comprising a second interconnect substrate and a second wafer bonded to the interconnect substrate and the wafer to form a stack.

* * * * *